United States Patent [19]

Smith et al.

[11] Patent Number: 5,306,389

[45] Date of Patent: Apr. 26, 1994

[54] METHOD OF PROTECTING ALUMINUM NITRIDE CIRCUIT SUBSTRATES DURING ELECTROLESS PLATING USING A SURFACE OXIDATION TREATMENT

[75] Inventors: Sandra L. Smith, Georgetown; Brian J. Hazen, Framingham, both of Mass.

[73] Assignee: Osram Sylvania Inc., Danvers, Mass.

[21] Appl. No.: 754,864

[22] Filed: Sep. 4, 1991

[51] Int. Cl.$^5$ .................................... C23C 26/00
[52] U.S. Cl. ................................. 156/625; 427/226; 427/255; 427/304; 427/309; 427/405; 427/437; 427/443.1
[58] Field of Search ............... 427/304, 305, 306, 437, 427/443.1, 309, 405, 226, 255; 333/238; 428/688, 689, 698, 209, 901, 457; 156/625

[56] References Cited

U.S. PATENT DOCUMENTS

| | | | |
|---|---|---|---|
| 3,993,808 | 11/1976 | Inaba | 427/437 |
| 4,122,215 | 10/1978 | Vratny | 427/304 |
| 4,125,648 | 11/1978 | Vratny | 427/305 |
| 4,154,877 | 5/1979 | Vratny | 427/304 |
| 4,349,585 | 9/1982 | Nagashima | 427/305 |
| 4,659,611 | 4/1987 | Iwase | 428/209 |
| 4,964,923 | 10/1990 | Takeuchi | 427/96 |
| 5,058,799 | 10/1991 | Zsamboky | 427/309 |
| 5,096,768 | 3/1992 | Kuromitsu | 428/209 |
| 5,164,246 | 11/1992 | Tanaka | 428/209 |
| 5,165,983 | 11/1992 | Sugiura | 428/688 |

FOREIGN PATENT DOCUMENTS 9067838  6/1974  Japan .................................. 427/437

*Primary Examiner*—Shrive Beck
*Assistant Examiner*—Vi Duong Dang

[57] ABSTRACT

A process for protecting aluminum nitride circuit substrates during electroless plating using surface oxidation. The aluminum nitride substrate is coated with a metal stack. The coating on the substrate is etched to form a circuit pattern. The patterned substrate is then fired in an oxidizing atmosphere at a temperature and time sufficient to convert the exposed aluminum nitride to aluminum oxide. After this conversion, the substrate is plated in an electroless solution forming a microwave circuit ready for component attachment and packaging.

4 Claims, No Drawings

METHOD OF PROTECTING ALUMINUM NITRIDE CIRCUIT SUBSTRATES DURING ELECTROLESS PLATING USING A SURFACE OXIDATION TREATMENT

BACKGROUND OF THE INVENTION

The present invention aluminum relates to a method for plating nitride substrates while protecting the aluminum nitride from the damaging effects of electroless gold plating solutions.

Materials with high thermal conductivity and low dielectric constant are required for high speed and high power microwave hybrid circuits. Alumina and beryllia are more conventional substrates used in microwave applications but are gradually being replaced by other substrates. Aluminum nitride (AlN) also exceeds the requirements and provides additional benefits as well. One of the major concerns in the processing of circuits on AlN, is AlN's extreme susceptibility to alkaline solutions. This presents a problem not only while cleaning the substrate but also during various metal etching and plating processes.

Aluminum nitride is an exceptionally difficult material to plate using electroless techniques. Most electroless gold plating solutions have a very high pH, usually 14, and aluminum nitride is very susceptible to damage in solutions with even a mildly high pH. It has been observed that even deionized water, with an average pH of 8.2, can have detrimental effects on the aluminum nitride. The effect of an alkaline solution on aluminum nitride is an actual etching of the surface. Exposed to a detergent solution for only seconds, the surface of AlN may be altered enough to substantially reduce the adhesion of thin and thick film metals.

Aluminum nitride substrates and an alumina ($Al_2O_3$) control substrate were placed in sodium hydroxide solutions having a pH of 14 and the etch rate was calculated. The control substrate, aluminum oxide, had an etch rate of 0.00% while that of aluminum nitride had an etch rate of between 3.16 and 4.10% by weight per hour depending on the concentration of the solution. This is an unacceptable rate of deterioration for any circuit application and will inevitably cause severe problems in future processing of the circuit.

Problems which arise because of this substrate etching effect are three fold. First, the plated pattern deposited by the electroless solution will have very poor adhesion, often to the extreme that the edges of pad areas and transmission lines will peel off during rinsing. Second, the solution may readily become contaminated by disassociated AlN. Electroless plating solutions are extremely sensitive to all types of contamination. A build up of aluminum in the plating bath will very quickly inactivate the solution as well as contaminate substrates being plated. The third problem is that of determining the thickness of the plated films. Typically, the thickness of plated metals is determined by a weight gain calculation. A substrate is weighed before and after plating and a calculation involving the density of plated gold can yield a very accurate value for gold thickness. This method, however, is inconclusive using aluminum nitride. When plating electroless gold onto a metal circuit pattern on aluminum nitride, the etch rate of the substrate far exceeds the deposition rate of the gold. The net effect is a decrease in overall weight of the substrate. Another means of measuring thickness is a stylus profilometer. In this process, a stylus is dragged across the surface of the substrate and differences in height are physically measured. For aluminum nitride, a stylus profilometer cannot be used to measure the thickness step since the measurement will be taken from the bottom of the etched substrate to the surface of the plated gold on the unetched areas, therefore, showing an artificially high thickness of gold. Because of the variation in density for plated gold, x-ray fluorescence is also not an accurate means of determining film thickness.

Aluminum nitride etching is only a problem during the plating process when a previously etched conductor pattern leaves ceramic material exposed in the plating solution. One option, which is not always available, is to plate up gold onto a completely metallized substrate and then pattern and etch the circuit. This process does not allow for very fine line definition or control of side-wall profiles compared to pre-patterned plating. In addition, this method is very costly and inefficient.

The present invention presents to the art a novel process for protecting AlN circuit substrates during electroless plating so that subsequent contact with electroless plating solutions does not cause substrate deterioration.

SUMMARY OF THE INVENTION

The present invention describes a process for forming a microwave hybrid circuit using aluminum nitride as the support substrate The aluminum nitride is initially coated with a metal stack such as titanium/tungsten, nickel and gold. The coated AlN is etched to form a circuit pattern exposing the AlN substrate. The patterned AlN is fired in an oxidizing atmosphere at a time and temperature sufficient to convert the exposed AlN to alumina. The fired substrate is then electrolessly plated to form the microwave circuit.

DETAILED DESCRIPTION OF PREFERRED EMBODIMENTS

Electroless plating is a necessary process for the plating of circuit boards with numerous pad areas and conductor lines. To plate conductive patterns on aluminum nitride substrates in an electroless plating solution, specifically gold, as it is a common conductor metal for microwave applications, one must first protect the exposed substrate areas. In the exemplary method described here the substrate is fired between 850° C. and 1000° C. in an atmosphere containing sufficient oxygen (e.g. air) to convert the aluminum nitride surface to aluminum oxide. This oxidation process occurs only on the exposed aluminum nitride and does not affect the metal layers or interfere with the subsequent plating process.

In addition, this is a self-limiting reaction and affects only the surface of the ceramic thereby having no effects on the electrical and thermal properties of the substrate. Substrates prepayed by this treatment have demonstrated reduced susceptibility to the electroless gold plating solution by as much as 99%, thus making the electroless procedure a viable one.

EXAMPLE I

To test the effectiveness of this invention, two aluminum nitride substrates were coated with thin films of titanium/tungsten, nickel, and gold. A circuit was patterned using photolithography and etched with inorganic acids leaving exposed areas of aluminum nitride.

One substrate was fired at 1000° C. in air for 10 minutes prior to plating. Both the fired and unfired substrates were then placed in a solution of IM sodium hydroxide for 60 minutes. The unfired aluminum nitride substrate showed a decrease of 3.72% by weight. The fired aluminum nitride substrate had a weight reduction of only 0.044%. This represents a 99% improvement due to the oxidation treatment of the substrate.

EXAMPLE II

One concern using this protection process was the possible negative effects of the firing on the existing thin films. To test this, fired substrates and unfired control substrates were electrolessly plated. The substrates were placed into an immersion gold solution for 15 minutes to apply a seed layer of gold onto the titanium/tungsten and nickel side walls. Both aluminum nitride substrates were then electrolessly gold plated for one hour. The two substrates were compared. The unfired aluminum nitride showed a decrease in overall weight after plating whereas the fired and oxidized substrate showed a net increase in weight. This not only implies that the substrate is not etching as quickly as the unfired control but also shows that the coating does not prohibit the gold plating process from occurring.

While there has been shown and described what is at present considered the preferred embodiment of the invention, it will be obvious to those skilled in the art that various alterations and modifications may be made therein without departing from the scope of the invention.

What is claimed is:

1. A method of forming a pattern on an aluminum nitride substrate comprising the steps of:
   coating said substrate, in sequence, with a layer of titanium/tungsten alloy, nickel and gold to form a coated substrate;
   etching said coated substrate to form a patterned substrate including metal areas and exposed aluminum nitride;
   firing said patterned substrate at a temperature of approximately 850° C. to 1000° C,. in an oxidizing atmosphere for a time sufficient to convert said exposed aluminum nitride to aluminum oxide and form a fired substrate; and
   placing said fired substrate in an electroless gold solution to plate the gold on said metal areas.

2. The method of claim 1 wherein said time is about 10 minutes.

3. The method of claim 1 wherein said oxidizing atmosphere is air.

4. A method according to claim 1 wherein the pH of said electroless gold solution is 12.0 or greater.

* * * * *